(12) United States Patent
Duong et al.

(10) Patent No.: US 8,251,009 B2
(45) Date of Patent: Aug. 28, 2012

(54) SHADOW FRAME HAVING ALIGNMENT INSERTS

(75) Inventors: Lan Duong, Saratoga, CA (US); William N. Sterling, Santa Clara, CA (US); John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 534 days.

(21) Appl. No.: 12/465,037

(22) Filed: May 13, 2009

(65) Prior Publication Data

US 2009/0283036 A1     Nov. 19, 2009

Related U.S. Application Data

(60) Provisional application No. 61/127,818, filed on May 14, 2008, provisional application No. 61/083,281, filed on Jul. 24, 2008.

(51) Int. Cl.
*B05C 13/00* (2006.01)

(52) U.S. Cl. .................. 118/500; 118/728; 156/345.51; 29/464; 269/289 R (58) Field of Classification Search ............. 156/345.51; 269/289 R; 118/500, 728; 29/464
See application file for complete search history.

(56) References Cited

U.S. PATENT DOCUMENTS

| | | | | |
|---|---|---|---|---|
| 5,518,593 A | * | 5/1996 | Hosokawa et al. | 204/192.12 |
| 5,593,541 A | * | 1/1997 | Wong et al. | 438/654 |
| 6,589,352 B1 | * | 7/2003 | Yudovsky et al. | 118/729 |
| 2009/0283036 A1 | * | 11/2009 | Duong et al. | 118/500 |
| 2010/0089319 A1 | * | 4/2010 | Sorensen et al. | 118/723 E |

* cited by examiner

*Primary Examiner* — Sylvia R. MacArthur
(74) *Attorney, Agent, or Firm* — Patterson & Sheridan, LLP (57) ABSTRACT

The present invention generally includes a shadow frame with alignment inserts that may permit the shadow frame to be properly aligned on the susceptor. The shadow frame may have one or more alignment inserts. The alignment inserts may be coupled to a cavity formed in the bottom surface of the shadow frame. The alignment inserts may be shaped to receive an alignment button that may be present on the susceptor. Thus, as the susceptor raises to the processing position and retrieves the shadow frame, the shadow frame may align properly on the susceptor.

20 Claims, 10 Drawing Sheets

SHADOW FRAME HAVING ALIGNMENT INSERTS

CROSS-REFERENCE TO RELATED APPLICATIONS

This application claims benefit of U.S. Provisional Patent Application Ser. No. 61/127,818 (APPM/13538L), filed May 14, 2008, and U.S. Provisional Patent Application Ser. No. 61/083,281 (APPM/13538L02), filed Jul. 24, 2008, both of which are herein incorporated by reference.

BACKGROUND OF THE INVENTION

1. Field of the Invention

Embodiments of the present invention generally relate to a shadow frame used for substrate processing.

2. Description of the Related Art

When depositing material onto a substrate during processing, material may deposit onto other areas of the processing chamber as well. If the substrate is not as large as the susceptor, then material may deposit onto the susceptor upon which the substrate may be situated during processing. Material deposited onto the susceptor may be problematic because the material may flake off during susceptor movement and/or substrate movement. The material that flakes off may contaminate the substrate or substrates later processed in the same processing chamber.

Additionally, material deposited on the substrate may bridge to material deposited on the susceptor. When the substrate is removed, the bridged material may break and potentially damage the substrate and/or the material deposited on the substrate.

When material is deposited onto the susceptor, the susceptor surface that receives the substrate may not be substantially planar and thus, substrates that are placed on the susceptor may not be properly aligned. The substrate could break. The material buildup on the susceptor could also lead to uneven deposition on the substrate. Because the substrate may not be resting on a planar surface, the substrate may bend and thus, the deposition surface of the substrate may not be substantially planar which may lead to uneven deposition.

Therefore, there is a need in the art to prevent or reduce deposition from occurring on a susceptor not covered by a substrate during processing.

SUMMARY OF THE INVENTION

The present invention generally includes a shadow frame with alignment inserts that may permit the shadow frame to be properly aligned on the susceptor. The shadow frame may have one or more alignment inserts. The alignment inserts may be coupled to a cavity formed in the bottom surface of the shadow frame. The alignment inserts may be shaped to receive an alignment button that may be present on the susceptor. Thus, as the susceptor raises to the processing position and retrieves the shadow frame, the shadow frame may align properly on the susceptor.

In one embodiment, the shadow frame includes an alignment insert having a main body with one or more surfaces for receiving an alignment button coupled with a susceptor. The shadow frame may also include a shadow frame body coupled with the alignment insert. The shadow frame body may have a top surface, a bottom surface, and a plurality of side surfaces. The bottom surface may have a cavity therein for receiving the alignment insert. One or more fastening mechanisms may be coupled with the alignment insert and the shadow frame body. The one or more fastening mechanisms may be with the alignment insert and the shadow frame body through a side surface of the shadow frame body.

In another embodiment, the shadow frame includes an alignment insert having a main body with an opening for the reception of the alignment button coupled to the susceptor. Alignment rods may be located inside the opening. Flanges may extend from the main body. The main body and the flanges may be placed into a cavity on the shadow frame, and the alignment rods within the opening of the main body may be coupled with an alignment button on the susceptor to align the shadow frame with the susceptor.

In another embodiment, the shadow frame includes an alignment insert having a main body with an opening for the reception of the alignment button coupled to the susceptor. Alignment rollers may be located inside the opening. Flanges may extend from the main body. The main body and the flanges may be placed into a cavity on the shadow frame, and the alignment rollers within the opening of the main body may be coupled with an alignment button on the susceptor by rolling down the button to align the shadow frame with the susceptor.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present invention generally includes alignment inserts that may be placed into the shadow frame to permit the shadow frame to be properly aligned on the susceptor during processing. The susceptor may have a button extending from a top surface. The button may have a tapered surface for engaging with the alignment insert of the shadow frame. The alignment insert may be coupled with the shadow frame with a fastening mechanism that is inserted through the shadow frame from a side surface that is adjacent and substantially perpendicular to the surface which receives the alignment insert. The alignment insert permits the shadow frame to be properly aligned on the susceptor. The shadow frame may reduce deposition on the areas of the susceptor not covered by the substrate during processing.

The invention, as described below, may be practiced in a PECVD system available from AKT America, Inc., a subsidiary of Applied Materials, Inc., Santa Clara, Calif. It is contemplated that the invention may be practiced in other plasma processing chambers, including those from other manufacturers.

Figure 1:
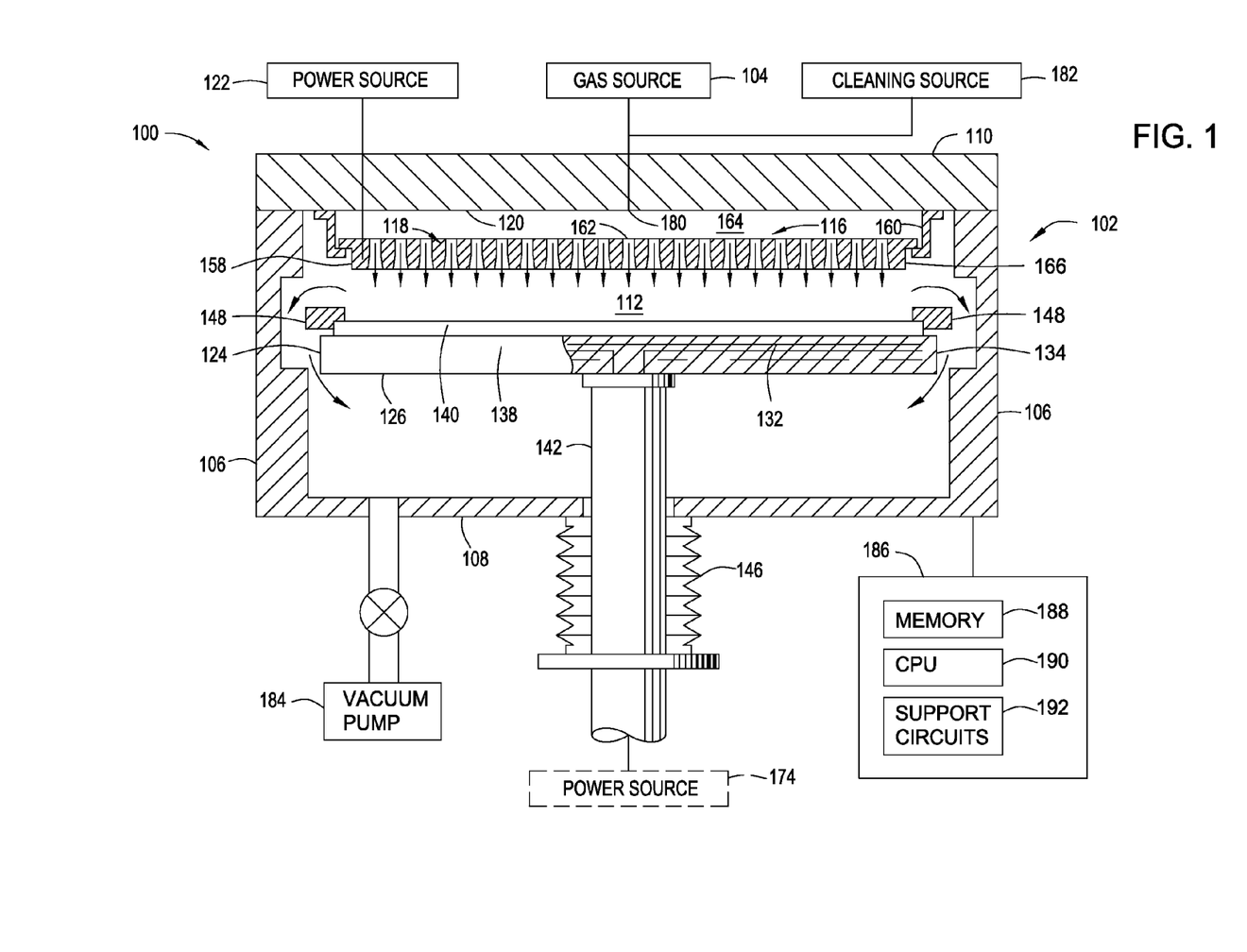
FIG. 1 illustrates a cross sectional view of a PECVD chamber 100 that may be used in connection with one or more embodiments of the invention.

FIG. 1 is a schematic cross-sectional view of one embodiment of a PECVD system 100. It is to be understood that the invention may be practiced on other processing systems that necessitate introducing a gas into the chamber, including those processing systems produced by other manufacturers. The system 100 may include a processing chamber 102 coupled to a gas source 104. The processing chamber 102 has walls 106 and a bottom 108 that partially define a process volume 112. The process volume 112 may be accessed through a port (not shown) in the walls 106 that facilitate movement of a substrate 140 into and out of the processing chamber 102. The walls 106 and bottom 108 may be fabricated from a unitary block of aluminum or other material compatible with processing. The walls 106 support a lid assembly 110. The processing chamber 102 may be evacuated by a vacuum pump 184.

A temperature controlled substrate support assembly 138 may be centrally disposed within the processing chamber 102. The support assembly 138 may support a substrate 140 during processing. The support assembly 138 may have a susceptor 134. The susceptor 134 supports the substrate 140. A stem 142 may be coupled to the lower side of the support assembly 138. The stem 142 couples the support assembly 138 to a lift system (not shown) that moves the support assembly 138 between an elevated processing position and a lowered position that facilitates substrate transfer to and from the processing chamber 102. The stem 142 additionally provides a conduit for electrical and thermocouple leads between the support assembly 138 and other components of the system 100.

A bellows 146 may be coupled between support assembly 138 (or the stem 142) and the bottom 108 of the processing chamber 102. The bellows 146 provides a vacuum seal between the chamber volume 112 and the atmosphere outside the processing chamber 102 while facilitating vertical movement of the support assembly 138.

The support assembly 138 may be grounded such that RF power supplied by a power source 122 to a gas distribution plate assembly 118 positioned between the lid assembly 110 and substrate support assembly 138 (or other electrode positioned within or near the lid assembly of the chamber) may excite gases present in the process volume 112 between the support assembly 138 and the distribution plate assembly 118. The RF power from the power source 122 may be selected commensurate with the size of the substrate to drive the chemical vapor deposition process.

The support assembly 138 may additionally support a circumscribing shadow frame 148. The shadow frame 148 may prevent deposition at the edge of the substrate 140 and support assembly 138 so that the substrate 140 may not stick to the support assembly 138.

As shown in FIG. 1, a controller 186 may interface with and control various components of the substrate processing system. The controller 186 may include a central processing unit (CPU) 190, support circuits 192 and a memory 188.

The processing gas may enter into the chamber 102 from the gas source 104 and be exhausted out of the chamber 102 by a vacuum pump 184. As will be discussed below, when the substrate 140 is placed on the susceptor 134, the susceptor 134 raises to meet the shadow frame 148 such that the shadow frame 148 is placed around the substrate 140 to cover the area on the susceptor 134 that is exposed to the processing gas in the processing chamber 102. To ensure the shadow frame 148 is properly aligned onto the susceptor, alignment inserts may be used. By placing the shadow frame 148 around the substrate 140, the deposition at the edge of the substrate 140 and the susceptor 134 may be reduced.

Figure 2A:
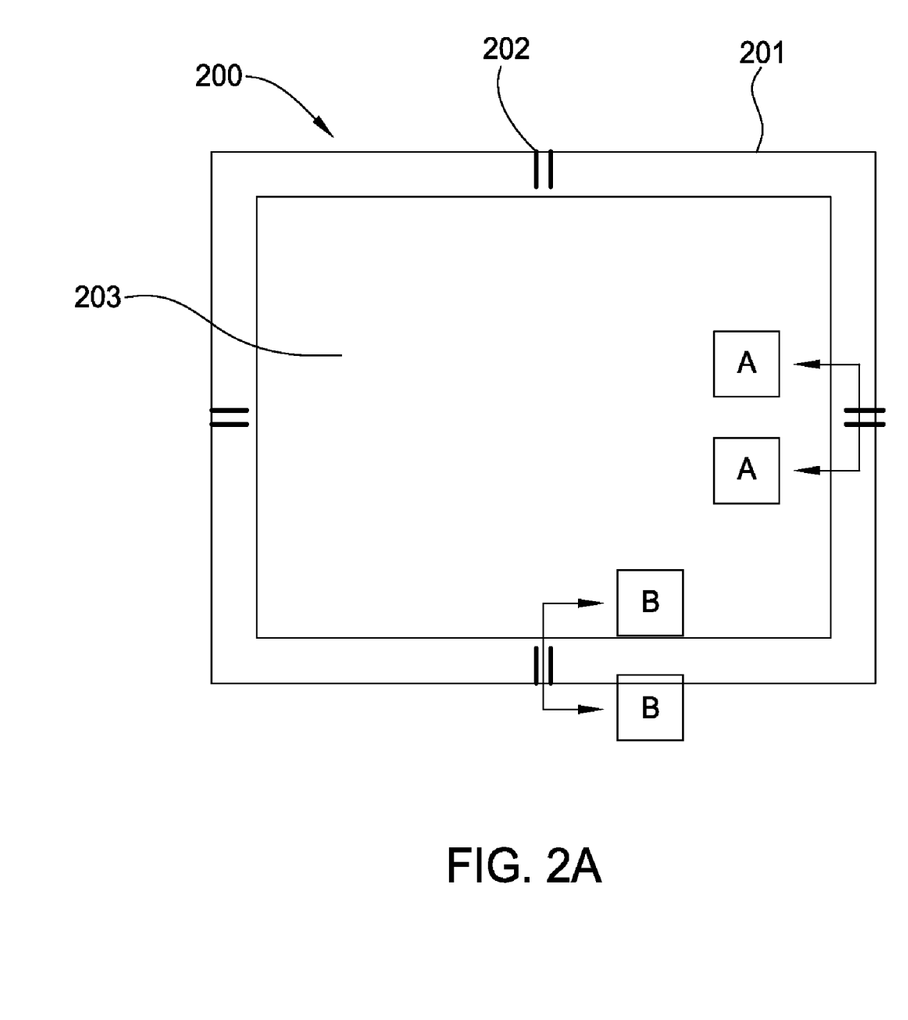
FIG. 2A is a schematic top view of a shadow frame 200 according to one embodiment of the invention.

FIG. 2A is a schematic top view of a shadow frame 200 according to one embodiment of the invention. The shadow frame comprises a main body 201, and an opening 203 where the substrate may be located. The main body 201 further comprises a top surface, a bottom surface, and a plurality of side surfaces. In one embodiment, the shadow frame 200 may comprise a metal. In another embodiment, the shadow frame 200 may comprise aluminum.

Figure 2B:
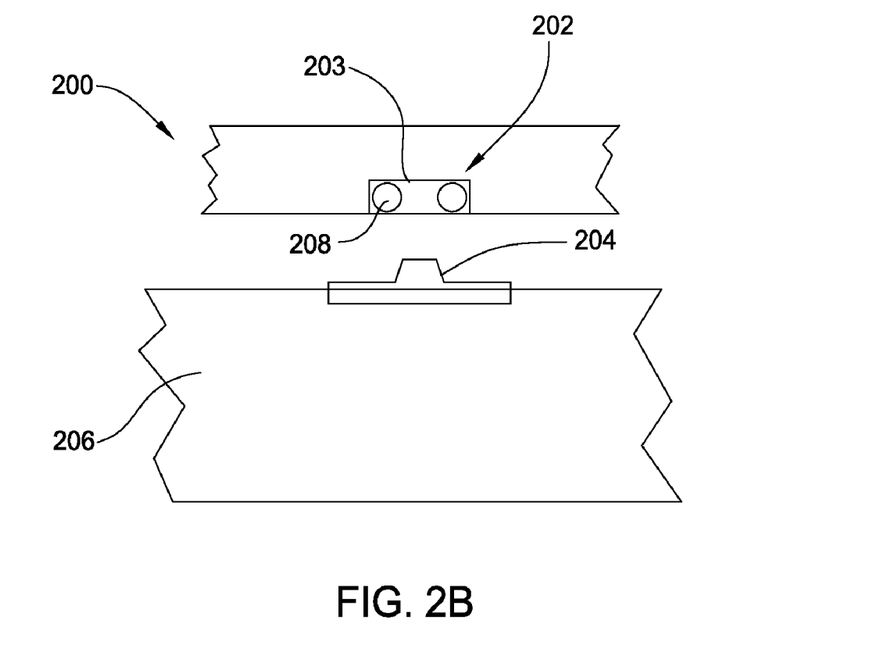
FIG. 2B is a schematic cross sectional view taken along section A-A of FIG. 2A with the shadow frame raised above the susceptor according to one embodiment of the invention.

FIG. 2B is a schematic cross sectional view taken along section A-A of FIG. 2A with the shadow frame 200 raised above the susceptor 206 according to one embodiment of the invention. The shadow frame 200 may further comprise an alignment insert 202. The alignment insert 202 may be placed in a cavity on the bottom surface of the main body and be used to align the shadow frame 200 with a susceptor 206. In one embodiment, the alignment insert 202 may comprise a metal body 203. In another embodiment, the metal body 203 may comprise aluminum. In yet another embodiment, multiple alignment inserts 202 may be present on the shadow frame 200.

The shadow frame 200 is shown spaced from the susceptor 206. The susceptor 206 may have a button 204 coupled thereto. The button 204 may have one or more tapered surfaces that extend above the surface of the susceptor 206. The button 204 will engage with the alignment insert 202 to align the shadow frame 200 on the susceptor 206. In one embodiment, the button 204 may comprise an insulating material. In another embodiment, the button 204 may comprise a ceramic material. In one embodiment, the susceptor 206 may comprise metal. In another embodiment, the susceptor 206 may comprise aluminum.

One advantage of using ceramic material for the button 204 is that when there is constant heat applied to the substrate within the chamber, the button 204 made with ceramic material may not expand or contract due to the heat factor, thus when the button 204 is engaged with the alignment insert 202, the size and shape of the button 204 may remain substantially constant, and the engagement between the button 204 and the alignment insert 202 may remain tightly secured in place. Therefore the alignment between the shadow frame 200 and the susceptor 206 may remain in uniform and proper position.

The alignment insert 202 may have one or more alignment rods 208 extending therein. The one or more alignment rods 208 may be used to receive the button 204 that is coupled to the susceptor 206. In one embodiment, the alignment rods 208 may comprise an insulating material. In another embodiment, the alignment rods 208 may comprise a ceramic material. In one embodiment, two alignment rods 208 may be present that are substantially parallel and spaced apart to receive the tapered button 204 that is coupled to the susceptor 206. In another embodiment, four alignment rods 208 may be present. Two of the alignment rods 208 may be substantially parallel to each other and the other two alignment rods 208 may be substantially parallel to each other but substantially perpendicular to the two alignment rods 208. When four alignment rods 208 are used, the alignment rods 208 substantially surround the tapered button 204 when the shadow frame 200 is engaged to the susceptor 206. In one embodiment, the number of buttons 204 on the susceptor 206 is the same as the number of alignment inserts 202 on the shadow frame 200. The buttons 204 and the alignment inserts 202 may be located at any desired location even though FIG. 2A shows the locations to be in the substantial center of the sides of the shadow frame 200.

Figure 2C:
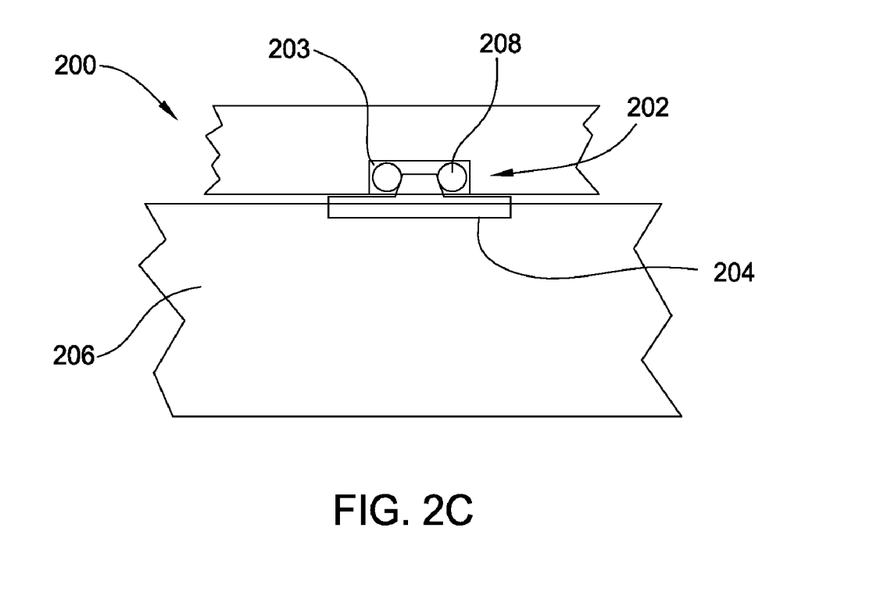
FIG. 2C is a schematic cross sectional view taken along section A-A of FIG. 2A with the shadow frame engaged with the susceptor according to one embodiment of the invention.

FIG. 2C is a schematic cross sectional view taken along section A-A of FIG. 2A with the shadow frame 200 engaged with the susceptor 206 according to one embodiment of the invention. As shown in FIG. 2C, when the susceptor 206 is coupled with the shadow frame 200, the alignment rods 208 are in contact with the button 204. Thus, the metal body of the shadow frame 200 is spaced from the aluminum portions of the susceptor 206. Thus, the shadow frame 200 may be electrically isolated from the susceptor 206. In one embodiment, the alignment rods 208 may have a circular cross section. By using the alignment rods 208 with a circular cross section, the alignment rods 208 may slide down the tapered button 204 to properly align the shadow frame 200 on the susceptor 206.

Figure 2D:
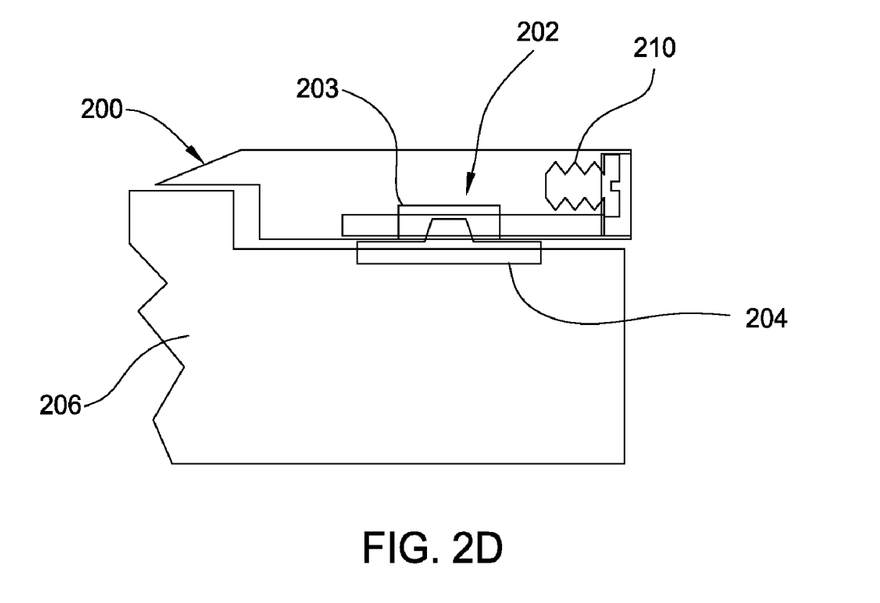
FIG. 2D is a schematic cross sectional view taken along section B-B of FIG. 2A with the shadow frame engaged with the susceptor according to one embodiment of the invention.

FIG. 2D is a schematic cross sectional view taken along section B-B of FIG. 2A with the shadow frame 200 engaged with the susceptor 206 according to one embodiment of the invention. A fastening mechanism 210 may be used to couple the alignment insert 202 to the shadow frame 200. In one embodiment, the fastening mechanism 210 may comprise a screw. In another embodiment, the fastening mechanism 210 may comprise an anodized aluminum screw. The fastening mechanism 210 may be coupled with the shadow frame 200 on a surface adjacent to and substantially perpendicular to the surface on which the button 204 is coupled with the susceptor 206. By placing the fastening mechanism 210 on a surface away from, and not adjacent to, the susceptor 206, the fastening mechanism 210 may be electrically isolated from the susceptor 206. If the fastening mechanism 210 were stripped, such as may occur with anodized fastening mechanisms, the fastening mechanism 210 will be spaced from the susceptor 206 and thus, arcing may be reduced.

Figure 3A:
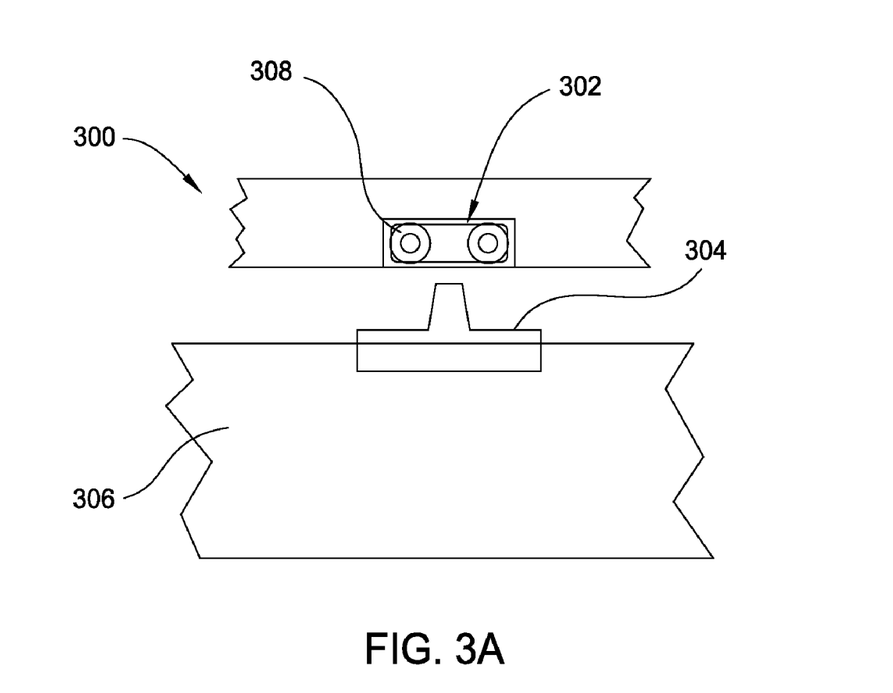
FIG. 3A is a schematic cross sectional view of a shadow frame having an alignment insert spaced from a susceptor according to another embodiment of the invention.

FIG. 3A is a schematic cross sectional view of a shadow frame 300 having an alignment insert 302 spaced from a susceptor 306 according to another embodiment of the invention. In the embodiment shown in FIG. 3A, the insert 302 may have one or more rollers 308 extending therein. The rollers 308 may be positioned in an alignment body that couples to the shadow frame 300. The one or more rollers 308 may be used to receive the button 304 that is coupled to the susceptor 306. In one embodiment, the rollers 308 may comprise an insulating material. In another embodiment, the rollers 308 may comprise a ceramic material. In one embodiment, two rollers 308 may be present that are substantially parallel and spaced apart to receive the tapered button 304 that is coupled to the susceptor 306. In another embodiment, four rollers 308 may be present. Two of the rollers 308 may be substantially parallel to the each other and the other two rollers 308 may be substantially parallel to each other but substantially perpendicular to the two rollers 308. When four rollers 308 are used, the rollers 308 substantially surround the tapered button 304 when the shadow frame 300 is engaged to the susceptor 306.

Figure 3B:
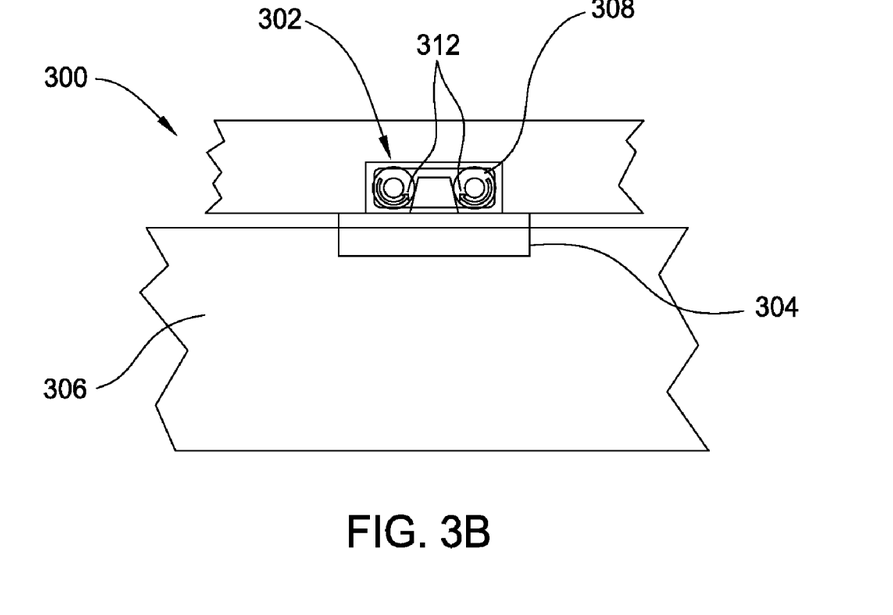
FIG. 3B is a schematic cross sectional view of the shadow frame of FIG. 3A engaged with a susceptor according to another embodiment of the invention.

FIG. 3B is a schematic cross sectional view of the shadow frame 300 of FIG. 3A engaged with a susceptor 306 according to another embodiment of the invention. As shown in FIG. 3B, when the susceptor 306 is coupled with the shadow frame 300, the rollers 308 are in contact with the button 304 by rolling down the tapered button 304 as indicated by the arrow 312 to properly align the shadow frame 300 on the susceptor 306. In one embodiment, the rollers 308 may have a circular shaped cross section.

Figure 3C:
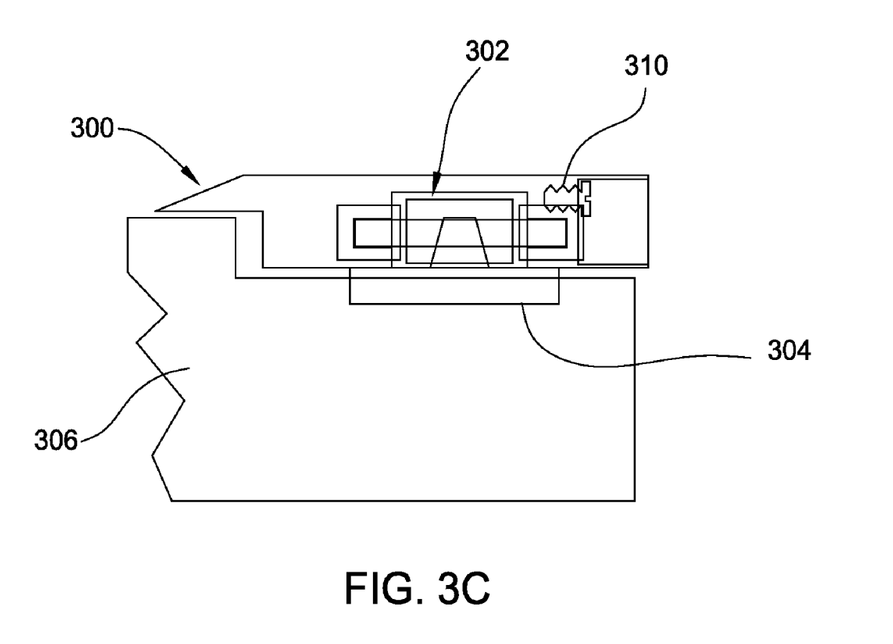
FIG. 3C is a schematic cross sectional view of FIG. 3B rotated 90 degrees according to another embodiment of the invention.

FIG. 3C is a schematic cross sectional view of FIG. 3B rotated 90 degrees according to another embodiment of the invention. A fastening mechanism 310 may be used to couple the alignment insert 302 to the shadow frame 300. In one embodiment, the fastening mechanism 310 may comprise a screw. In one embodiment, the fastening mechanism 310 may comprise an anodized aluminum screw. The fastening mechanism 310 may be coupled with the shadow frame 300 on a surface adjacent to and substantially perpendicular to the surface on which the button 304 is coupled with the susceptor 306.

One advantage of using a circular shaped alignment rod 208 or roller 308 in an alignment body coupled to a shadow frame 200, 300 is that when the button 204, 304 is coupled with the alignment rod 208 or roller 308, the vertically rolling action of the alignment rod 208 or roller 308 may ensure maximum mating of the alignment rod 208 or roller 308 with the button 204, 304, therefore securing the shadow frame 200, 300 tightly onto the susceptor 206, 306.

Figure 4A:
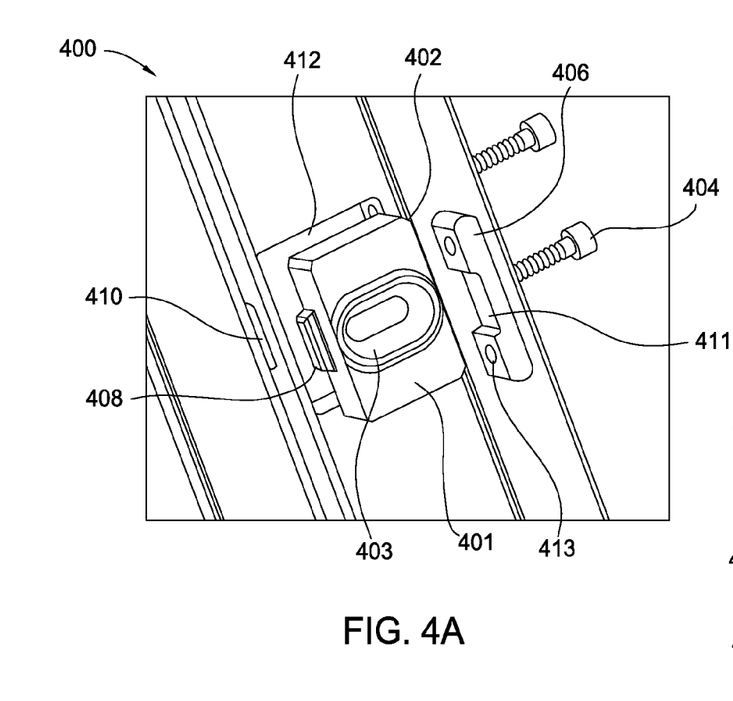
FIG. 4A is a schematic isometric view of an alignment insert for a shadow frame according to another embodiment of the invention.
Figure 4B:
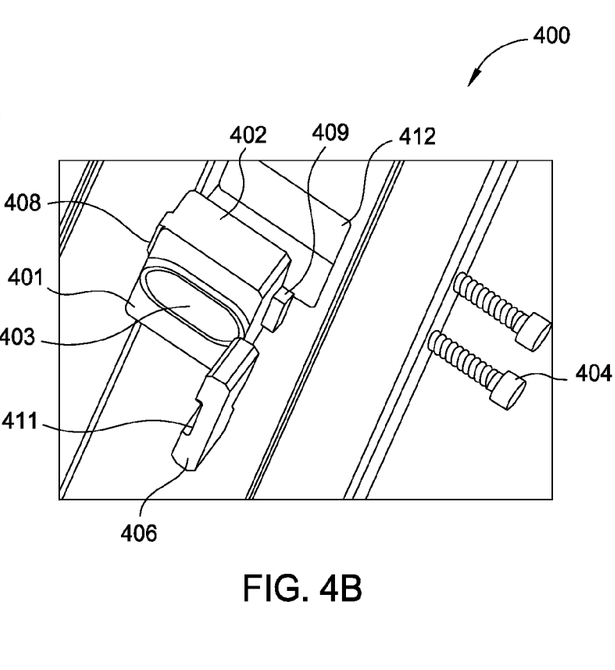
FIG. 4B is a schematic isometric view of FIG. 4A rotated 90 degrees according to another embodiment of the invention.

FIG. 4A is a schematic isometric view of an alignment insert 402 for a shadow frame 400 according to another embodiment of the invention. In conjunction with FIG. 4A, FIG. 4B is a schematic isometric view of FIG. 4A rotated 90 degrees according to another embodiment of the invention. In one embodiment, the alignment insert 402 may comprise an insulating material. In another embodiment, the alignment insert 402 may comprise a ceramic material. The alignment insert 402 may comprise a main body 401 with a cavity 403, a first notch 408 that inserts into a slot 410 formed in the shadow frame 400, a second notch 409, and a spacer 406. The cavity 403 may have tapered walls for receiving the button (not shown) that may be present on the susceptor (not shown). To place the alignment insert 402 into the cavity 412, the first notch 408 is inserted into the slot 410 in the shadow frame 400. The spacer 406 then is inserted into the cavity 412 of the shadow frame 400. The second notch 409 on the main body 401 of the alignment insert 402 is used to couple with a slit 411 on the spacer 406 thereby aligning the spacer 406 to the alignment insert 402. In one embodiment, the spacer 406 may comprise a metal. In another embodiment, the spacer 406 may comprise aluminum. In yet another embodiment, the spacer 406 may comprise anodized aluminum. One or more fastening mechanisms 404 may be used to couple the spacer 406 and the insert 402 to the shadow frame 400. In one embodiment, the one or more fastening mechanisms 404 may be a screw. The screws may be inserted from the side of the shadow frame 400 through screw tapped holes 413. The screw tapped holes 413 may be present and aligned through out the shadow frame 400, the spacer 406 and the main body 401 of the insert 402.

Figure 4C:
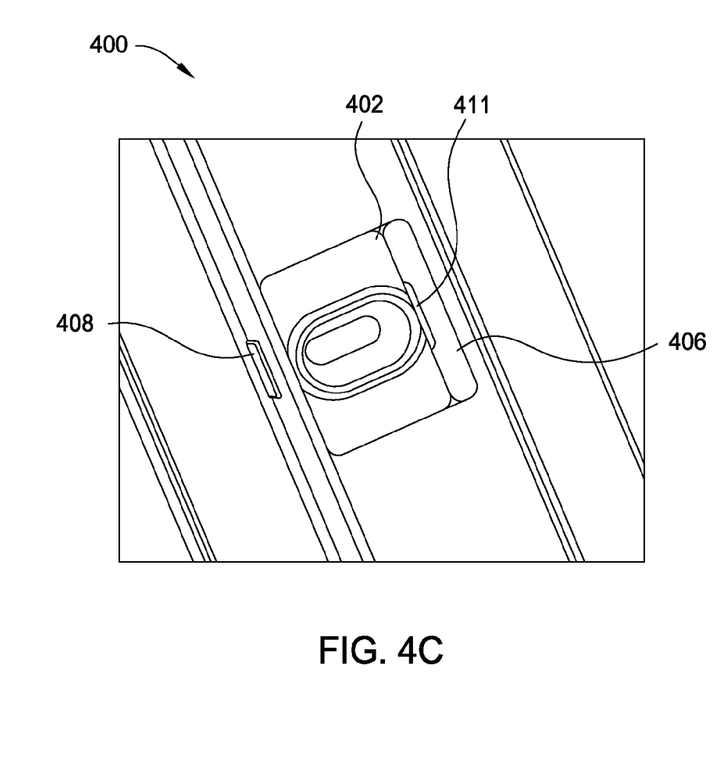
FIG. 4C is a schematic isometric view of the alignment insert of FIG. 4A coupled with the shadow frame according to another embodiment of the invention.

FIG. 4C is a schematic isometric view of the alignment insert 402 of FIG. 4A coupled with the shadow frame 400 according to another embodiment of the invention. As shown in FIG. 4C, the first notch 408 fits into the slot 410 of the shadow frame 400 to secure one end of the alignment insert 402 to the shadow frame 400. The spacer 406 may fit over the other end of the alignment insert 402 by coupling the second notch 409 to the slit 411 on the spacer 406. The alignment insert 402 is further secured to the shadow frame 400 by the fastening mechanism 404.

Figure 5A:
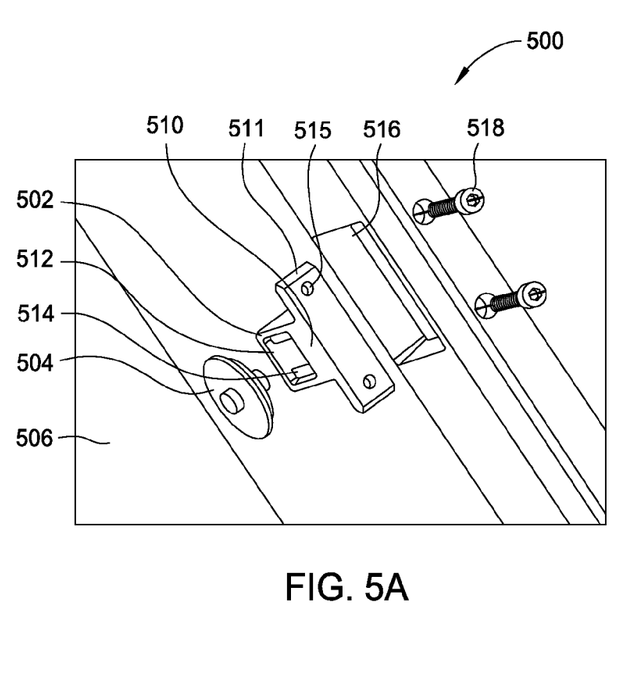
FIG. 5A is a schematic isometric view of an alignment insert and button according to another embodiment of the invention.
Figure 5B:
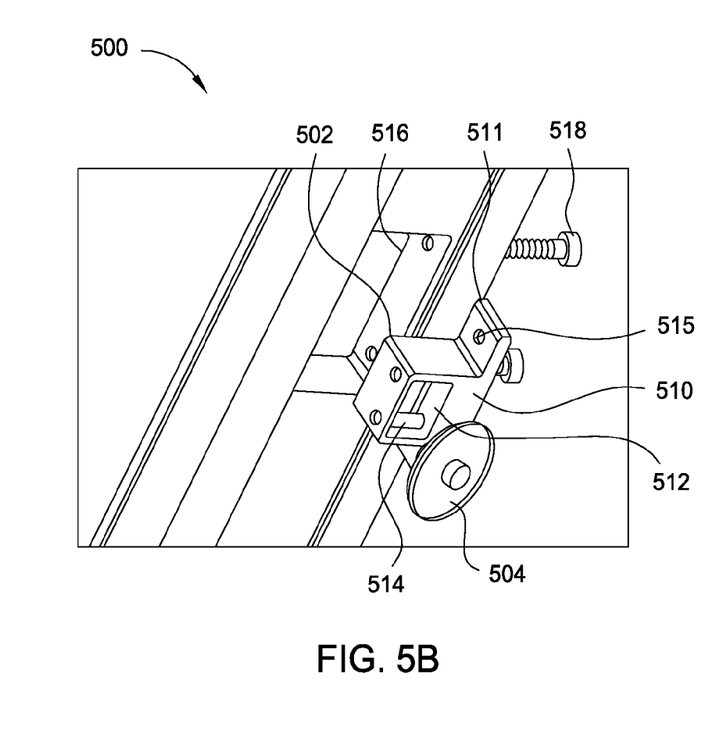
FIG. 5B is a schematic isometric view of FIG. 5A rotated 90 degrees according to another embodiment of the invention.

FIG. 5A is a schematic isometric view of an alignment insert 502 and button 504 according to another embodiment of the invention. FIG. 5B is a schematic isometric view of FIG. 5A rotated 90 degrees according to another embodiment of the invention. The alignment insert 502 comprises a main body 510, an opening 512 within the main body 510 for the reception of the button 504 coupled to the susceptor 506, and alignment rods 514 located inside the opening 512. In one embodiment, the alignment rods 514 may comprise an insulating material. In another embodiment, the alignment rods 514 may comprise a ceramic material. As shown, two alignment rods 514 may be present that are substantially parallel and spaced apart to receive the button 504 that is coupled to the susceptor 506. The alignment insert 502 may be placed into a cavity 516 on the shadow frame 500 and secured by one or more fastening mechanisms 518. The one or more fastening mechanisms 518 may be used to couple the alignment insert 502 to the shadow frame 500. The alignment insert 502 may have flanges 511 that extend from the main body 510. The one or more fastening mechanisms 518 may be placed through the flanges 511 to secure the alignment insert 502 to the shadow frame 500. In one embodiment, the one or more fastening mechanisms 518 may be a screw. The screws may be inserted from the side of the shadow frame 500 through the screw tapped holes 515. The screw tapped holes 515 may be present and aligned throughout the shadow frame 500 and the flanges 511 of the main body 510 of the alignment insert 502.

Figure 5C:
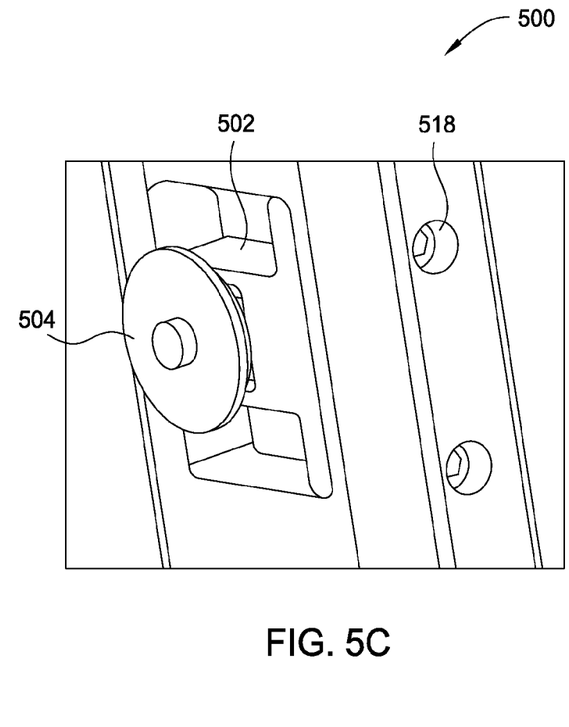
FIG. 5C is a schematic isometric view of the alignment insert and button coupled together according to another embodiment of the invention.

FIG. 5C is a schematic isometric view of the alignment inserts 502 and button 504 coupled together according to another embodiment of the invention. As shown in FIG. 5C, the screw of the fastening mechanism 518 is inserted from the side of the shadow frame 500 to avoid surface contact with the susceptor, therefore arcing may be reduced. In one embodiment, the one or more fastening mechanisms 518 may comprise anodized aluminum.

Figure 6A:
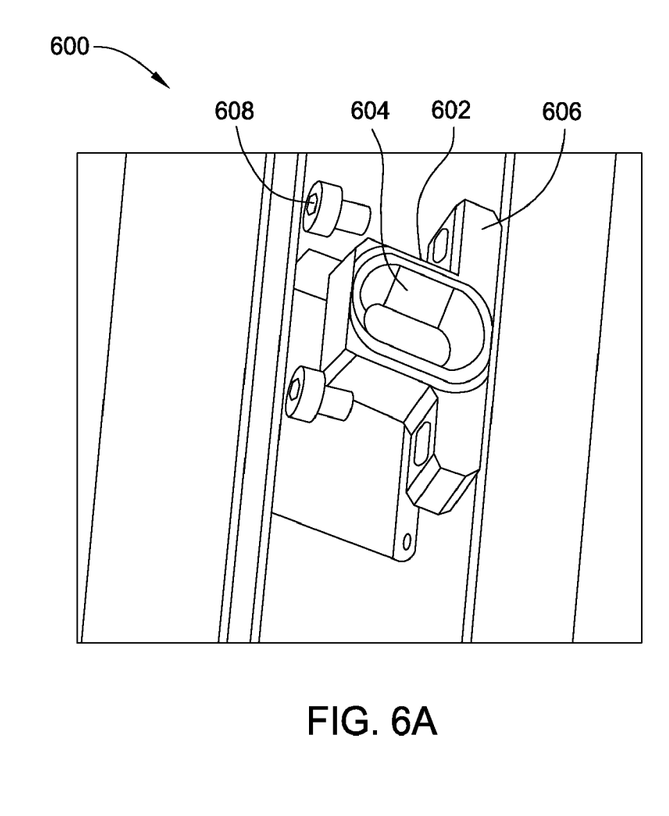
FIG. 6A is a schematic isometric view of an alignment insert spaced from a shadow frame according to another embodiment of the invention.
Figure 6B:
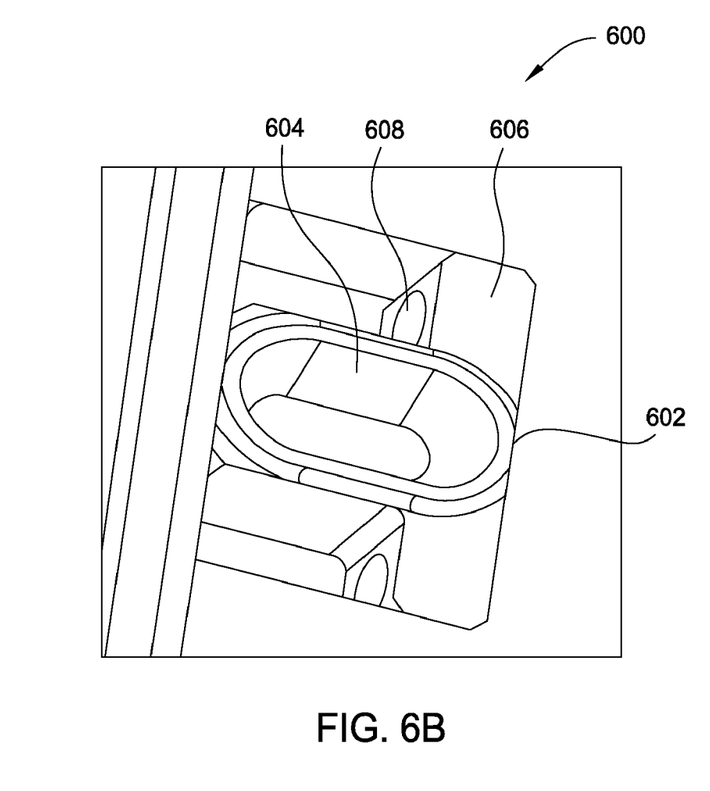
FIG. 6B is a schematic isometric view of the alignment insert and shadow frame of FIG. 6A coupled together according to another embodiment of the invention.

FIG. 6A is a schematic isometric view of an alignment insert 602 spaced from a shadow frame 600 according to another embodiment of the invention. FIG. 6B is a schematic isometric view of the alignment insert 602 and shadow frame 600 of FIG. 6A coupled together according to another embodiment of the invention. In the embodiment shown in FIGS. 6A and 6B, the alignment insert 602 may have a tapered surface 604 for receiving the alignment button (not shown) that may be coupled with the susceptor (not shown). The alignment insert 602 may also have flanges 606 that extend therefrom through which fastening mechanisms 608 may be placed to secure the alignment insert 602 to the shadow frame 600. In one embodiment, the fastening mechanisms 608 may be a screw. In another embodiment, the screw may be anodized aluminum. In yet another embodiment, the screw may be inserted and tightened from the flanges 606.

Figure 7A:
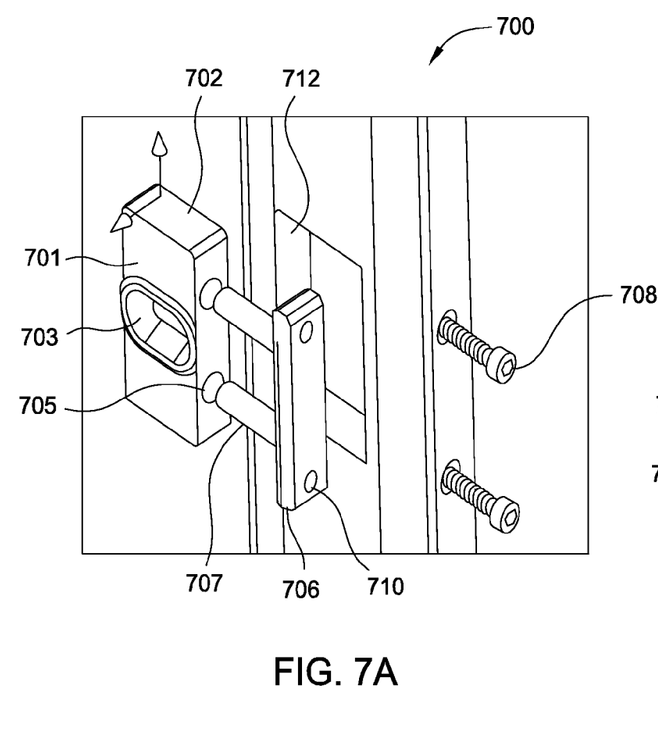
FIG. 7A is a schematic isometric view of an alignment insert spaced from a shadow frame according to another embodiment of the invention.
Figure 7B:
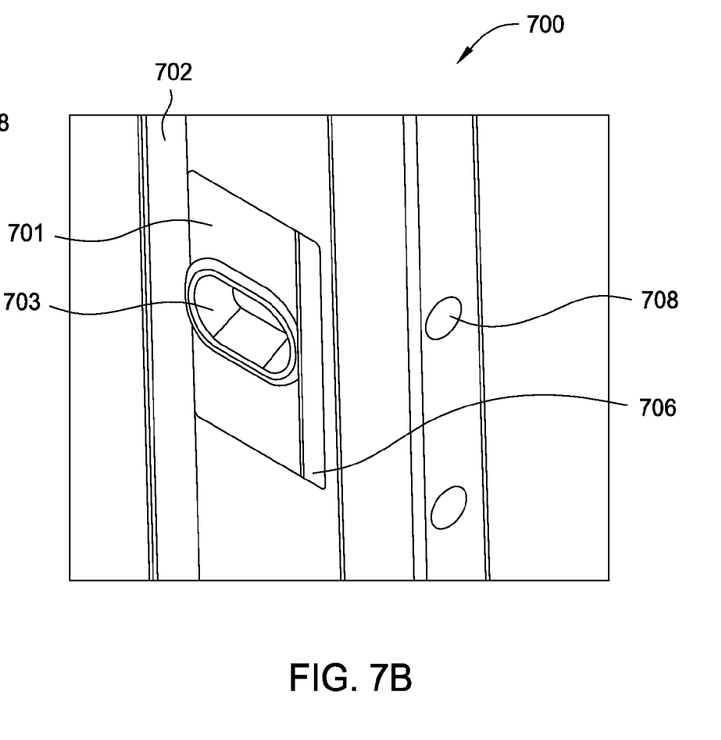
FIG. 7B is a schematic isometric view of the alignment inserts and shadow frame of FIG. 7A coupled together according to another embodiment.

FIG. 7A is a schematic isometric view of an alignment insert 702 spaced from a shadow frame 700 according to another embodiment of the invention. FIG. 7B is a schematic isometric view of the alignment insert 702 and shadow frame 700 of FIG. 7A coupled together according to another embodiment. In the embodiment shown in FIGS. 7A and 7B, the alignment insert 702 comprises a main body 701 with an opening 703 and a spacer 706. The opening 703 may have tapered walls for receiving the button (not shown) that may be present on the susceptor (not shown). On the spacer 706 are two alignment rods 707. The alignment rods 707 may be inserted into its corresponding holes 705 in the main body 701 of the alignment insert 702 to secure and align the spacer 706 to the main body 701. A cavity 712 is located on the shadow frame 700 for receiving of the alignment insert 702. To place the alignment insert 702 into the cavity 712, the spacer 706 is first fixed into the main body 701, and the alignment insert 702 is then inserted into the cavity 712 on the shadow frame 700. In one embodiment, the spacer 706 may comprise a metal. In another embodiment, the spacer 706 may comprise aluminum. In yet another embodiment, the spacer 706 may comprise anodized aluminum. One or more fastening mechanisms 708 may be used to couple the spacer 706 and the main body 701 of the alignment inserts 702 to the shadow frame 700. In one embodiment, the one or more fastening mechanisms 708 may be a screw. The screws may be inserted from the side of the shadow frame 700 through screw tapped holes 710. The screw tapped holes 710 may be present and aligned throughout the shadow frame 700, the spacer 706 and the main body 701 of the insert 702. By inserting the screws from the side of the shadow frame 700, the screws are able to avoid surface contact with the susceptor, therefore reduce the amount of arcing that may occur. In one embodiment, the one or more fastening mechanism 708 may comprise a metal. In another embodiment, the one or more fastening mechanisms 708 may comprise aluminum. In yet another embodiment, the one or more fastening mechanisms 708 may comprise anodized aluminum.

An alignment insert coupled with a shadow frame may be used to properly align a shadow frame on a susceptor and thus, prevent deposition on the susceptor. Alternatively, the alignment insert and the button in the embodiment disclosed herein may be interchangeable between the shadow frame and the susceptor. For example, the button may be placed on the shadow frame and the alignment insert may be place on the susceptor. By having the alignment insert and the button interchangeably placed on the shadow frame and the susceptor, it may be able to maintain a better alignment for the substrates on the susceptor, and also provide uniformity for the edges of the susceptor not covered by the substrates.

While the foregoing is directed to embodiments of the present invention, other and further embodiments of the invention may be devised without departing from the basic scope thereof, and the scope thereof is determined by the claims that follow.

The invention claimed is:

1. A shadow frame, comprising:
   an alignment insert having a main body with one or more surfaces for receiving an alignment button coupled with a susceptor;
   a shadow frame body coupled with the alignment insert, the shadow frame body having a top surface, a bottom surface, and a plurality of side surfaces, the bottom surface having a cavity therein for receiving the alignment insert; and
   one or more fastening mechanisms coupled with the alignment insert and the shadow frame body.

2. The shadow frame of claim 1, wherein the alignment insert comprises material selected from the group consisting of ceramic, metal, aluminum and combinations thereof.

3. The shadow frame of claim 2, wherein the shadow frame comprises a plurality of alignment inserts.

4. The shadow frame of claim 1, wherein the alignment insert further comprises one or more alignment rods configured to receive the alignment button coupled to the susceptor.

5. The shadow frame of claim 4, wherein the alignment rods comprise an insulating material or a ceramic material.

6. The shadow frame of claim 1, wherein the alignment inserts are located at the center along a side of the shadow frame.

7. The shadow frame of claim 1, wherein the fastening mechanism comprises an anodized aluminum screw.

8. The shadow frame of claim 1, wherein the alignment insert comprises one or more notches extending from the main body.

9. The shadow frame of claim 1, wherein the one or more fastening mechanisms are coupled with the alignment insert and the shadow frame body through a side surface of the shadow frame body.

10. The shadow frame of claim 1, wherein the one or more fastening mechanisms are coupled with the alignment insert and the shadow frame body through a surface of the cavity.

11. A shadow frame, comprising:
    an alignment insert having a main body with one or more surfaces for receiving an alignment button coupled with a susceptor;
    a shadow frame body coupled with the alignment insert, the shadow frame body having a top surface, a bottom surface, and a plurality of side surfaces, the bottom surface having a cavity therein for receiving the alignment insert; and
    one or more fastening mechanisms coupled with the alignment insert and the shadow frame body, wherein the alignment insert further comprises one or more rollers configured to receive the alignment button coupled to the susceptor.

12. The shadow frame of claim 11, wherein the rollers comprise an insulating material or a ceramic material.

13. A shadow frame, comprising:
    an alignment insert having a main body with one or more surfaces for receiving an alignment button coupled with a susceptor;
    a shadow frame body coupled with the alignment insert, the shadow frame body having a top surface, a bottom surface, and a plurality of side surfaces, the bottom surface having a cavity therein for receiving the alignment insert; and
    one or more fastening mechanisms coupled with the alignment insert and the shadow frame body, wherein the one or more fastening mechanisms comprise:
      a first notch that inserts into a slot formed in the shadow frame body,
      a second notch; and
      a spacer with a slit, wherein the main body and the spacer of the alignment insert are configured to be inserted into the cavity of the shadow frame body and secured by the first notch inserted into the slot formed in the shadow frame body and the second notch coupled with the slit on the spacer.

14. The shadow frame of claim 13, wherein the main body has flanges extending from the side.

15. The shadow frame of claim 13, wherein the main body comprises aluminum.

16. The shadow frame of claim 13, wherein the spacer comprises a metal.

17. The shadow frame of claim 13, wherein the spacer comprises aluminum.

18. The shadow frame of claim 13, wherein the spacer comprises anodized aluminum.

19. The shadow frame of claim 18, wherein the main body has flanges extending from the side.

20. The shadow frame of claim 19, wherein the main body comprises aluminum.

* * * * *